(12) United States Patent
Yang et al.

(10) Patent No.: US 7,838,885 B2
(45) Date of Patent: Nov. 23, 2010

(54) THIN FILM TRANSISTOR, METHOD OF FABRICATING THE THIN FILM TRANSISTOR, AND DISPLAY DEVICE INCLUDING THE THIN FILM TRANSISTOR

(75) Inventors: Tae-Hoon Yang, Suwon-si (KR); Ki-Yong Lee, Suwon-si (KR); Jin-Wook Seo, Suwon-si (KR); Byoung-Keon Park, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 41 days.

(21) Appl. No.: 12/138,884

(22) Filed: Jun. 13, 2008

(65) Prior Publication Data

US 2008/0308809 A1    Dec. 18, 2008

(30) Foreign Application Priority Data

Jun. 13, 2007    (KR) .................... 10-2007-0057900

(51) Int. Cl.
*H01L 27/14* (2006.01)
(52) U.S. Cl. ...................... 257/72; 257/59; 257/258; 257/E21.413
(58) Field of Classification Search ............... 257/59, 257/72, 258, E21.413
See application file for complete search history.

(56) References Cited

U.S. PATENT DOCUMENTS

| 6,620,661 B2 | 9/2003 | Maekawa et al. |
| 7,045,444 B2 | 5/2006 | Yamazaki et al. |
| 2002/0074548 A1* | 6/2002 | Lee et al. .................... 257/59 |
| 2003/0122129 A1 | 7/2003 | Yamazaki et al. |
| 2007/0284627 A1* | 12/2007 | Kimura .................... 257/257 |

FOREIGN PATENT DOCUMENTS

| CN | 1437761 | 8/2003 |
| JP | 2003-100633 | 4/2003 |
| JP | 2003-188098 | 7/2003 |
| KR | 2003-69852 | 8/2003 |
| KR | 2003-73076 | 9/2003 |
| KR | 2004-41074 | 5/2004 |
| KR | 2006-99694 | 9/2006 |

OTHER PUBLICATIONS

Korean Notice of Allowability for KR 2007-57900 issued on May 19, 2008.

* cited by examiner

*Primary Examiner*—Tan N Tran
(74) *Attorney, Agent, or Firm*—Stein McEwen, LLP

(57) ABSTRACT

A thin film transistor (TFT), a method of fabricating the TFT, and a display device including the TFT are provided. The TFT includes a semiconductor layer having a channel region and source and drain regions is crystallized using a crystallization-inducing metal. The crystallization-inducing metal is gettered by either a metal other than the crystallization-inducing metal or a metal silicide of a metal other than the crystallization-inducing metal. A length and width of the channel region of the semiconductor layer and a leakage current of the semiconductor layer satisfy the following equation: $Ioff/W=3.4E-15L^2+2.4E-12L+c$, wherein Ioff (A) is the leakage current of the semiconductor layer, W (mm) is the width of the channel region, L (μm) is the length of the channel region, and "c" is a constant ranging from 2.5E-13 to 6.8E-13.

16 Claims, 14 Drawing Sheets

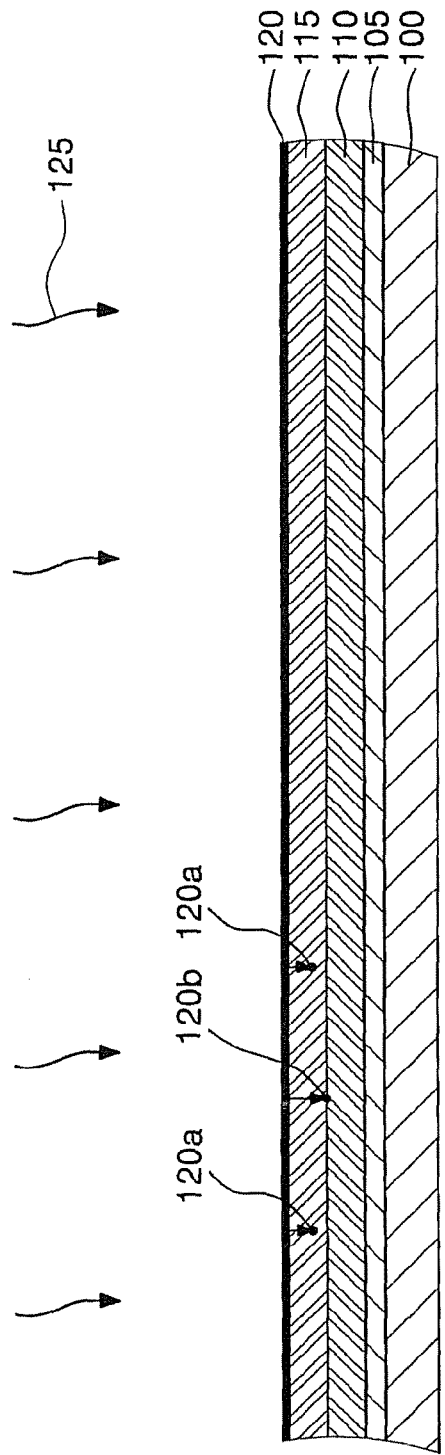
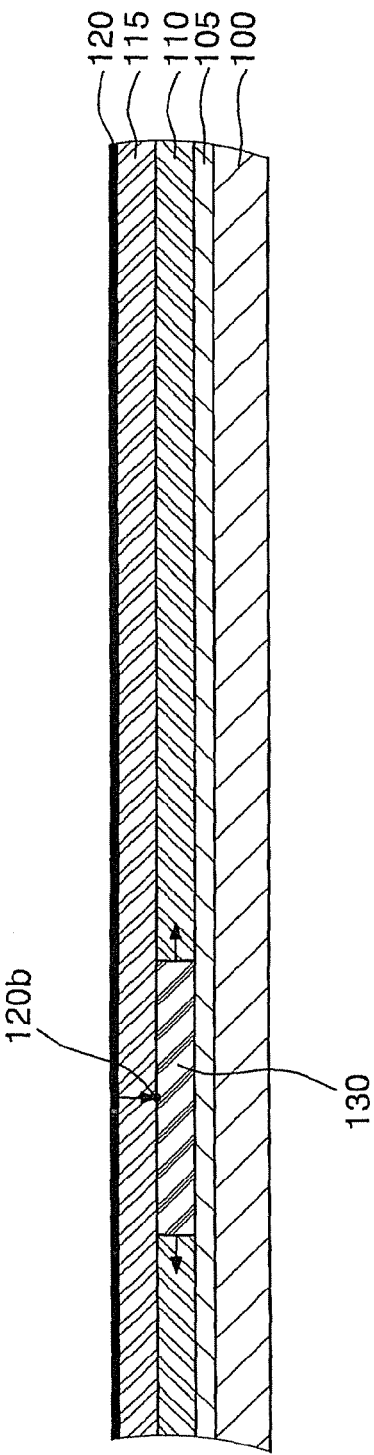

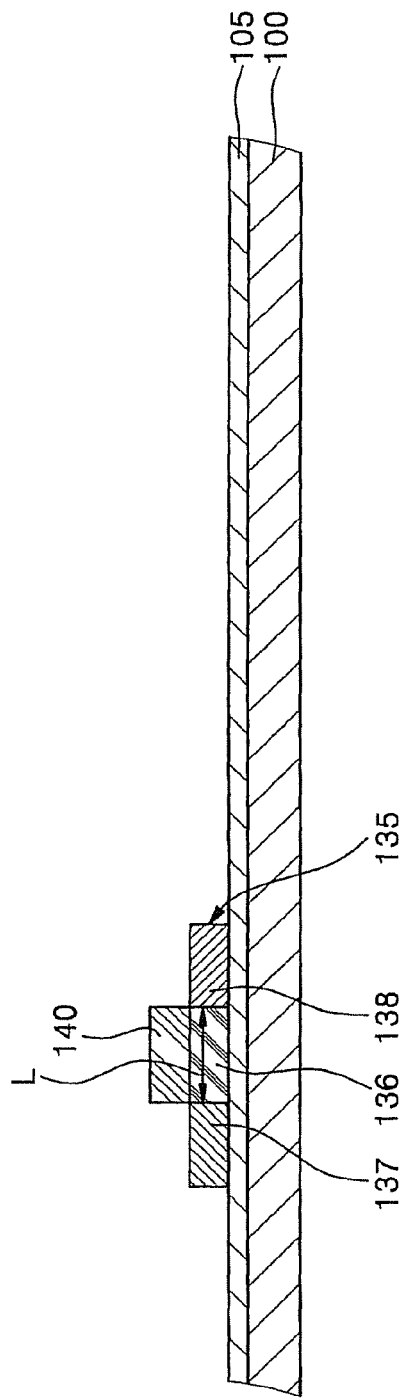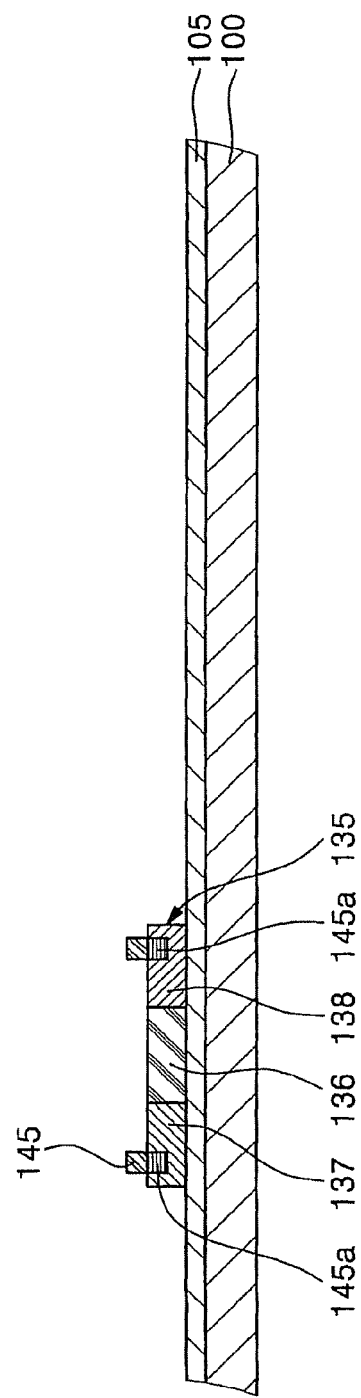

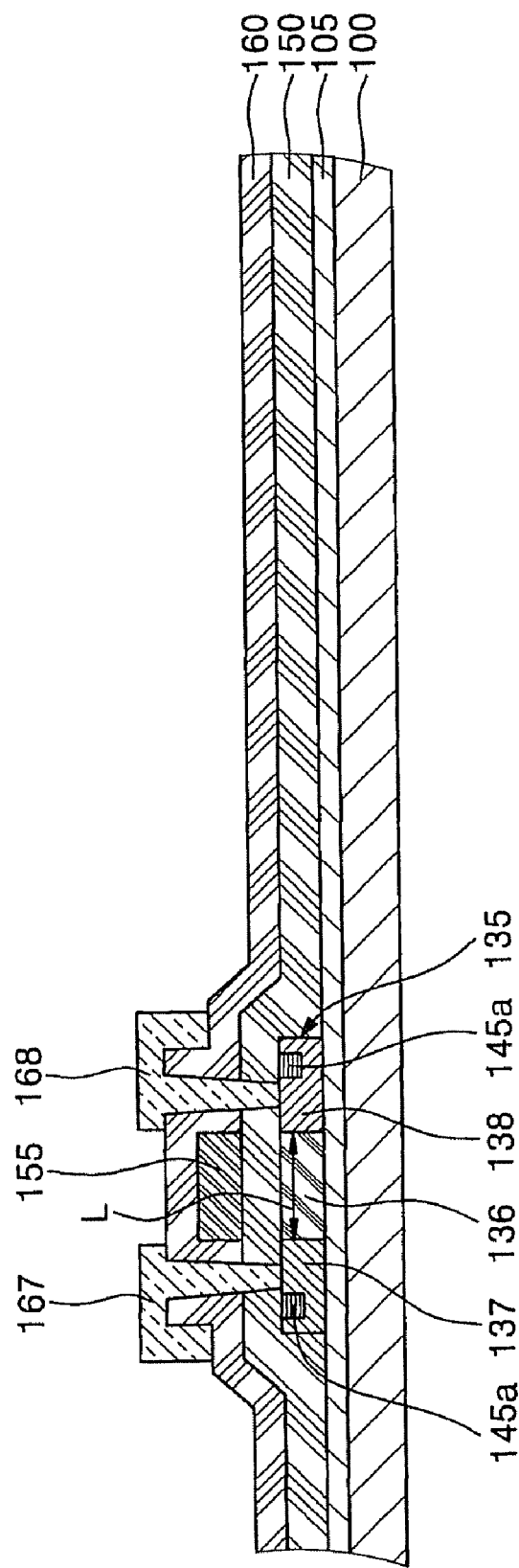

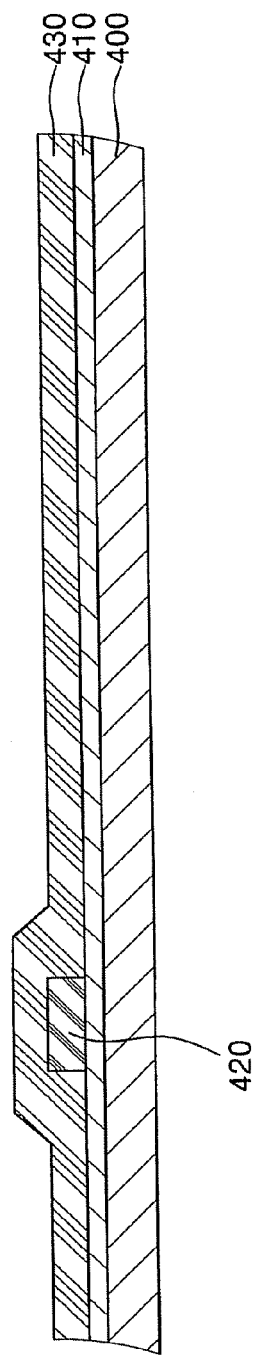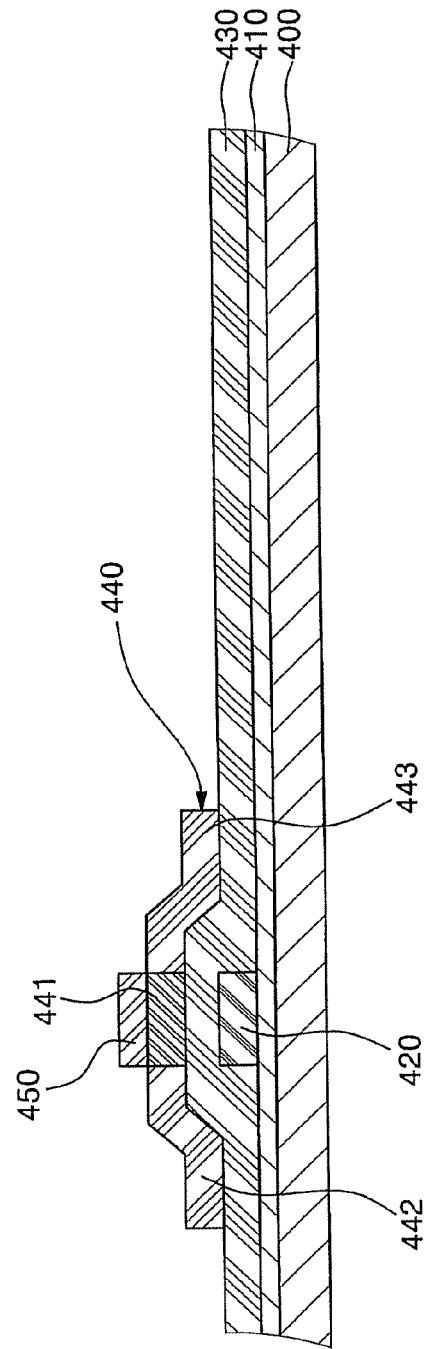

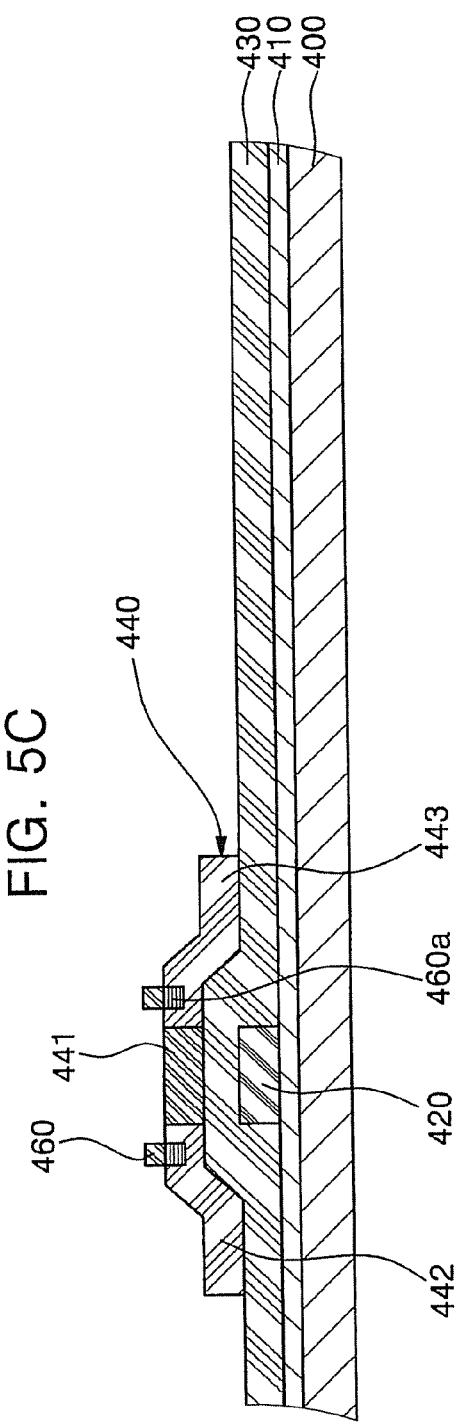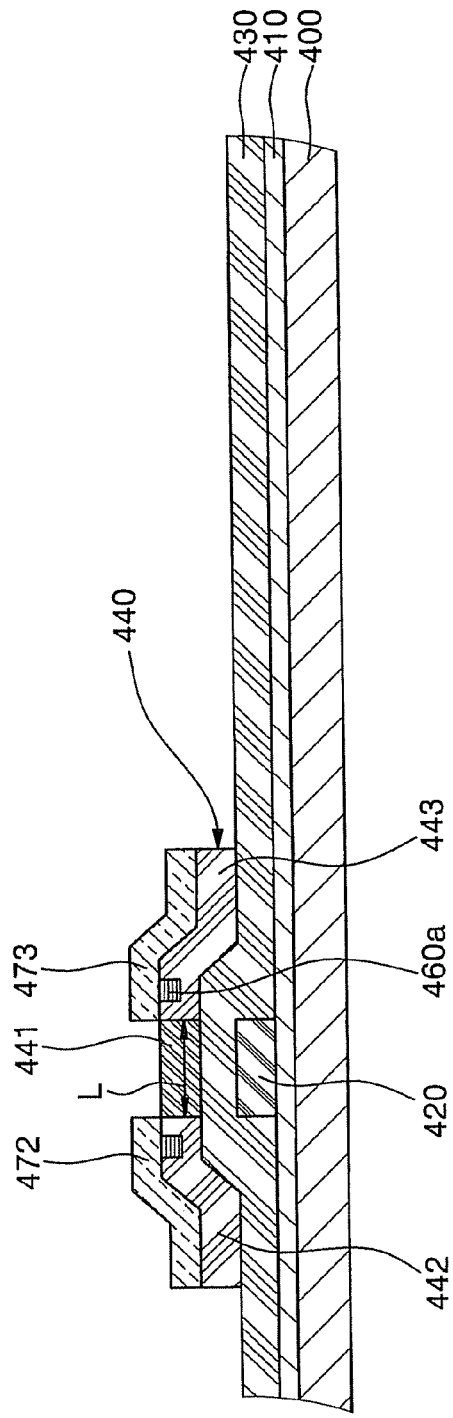

THIN FILM TRANSISTOR, METHOD OF FABRICATING THE THIN FILM TRANSISTOR, AND DISPLAY DEVICE INCLUDING THE THIN FILM TRANSISTOR

CROSS-REFERENCE TO RELATED APPLICATIONS

This application claims the benefit of Korean Patent Application No. 2007-57900, filed Jun. 13, 2007, the disclosure of which is incorporated herein by reference.

BACKGROUND OF THE INVENTION

1. Field of the Invention

Aspects of the present invention relate to a thin film transistor (TFT), a method of fabricating the TFT, and a display device including the TFT, and more particularly, to a TFT in which a length L (μm) of a channel region of a semiconductor layer and a leakage current Ioff/W(A/mm) per 1 mm of a width W of the channel region of the semiconductor layer satisfies a function Ioff/W=3.4E-15 $L^2$+2.4E-12 L+c, wherein "c" is a constant ranging from 2.5E-13 to 6.8E-13, a method of fabricating the TFT, and a display device including the TFT.

2. Description of the Related Art

In general, thin film transistors (TFTs) are used as active devices of active matrix liquid crystal displays (AMLCDs) and switching devices and driving devices of organic light emitting diode (OLED) display devices. It is necessary to control the characteristics of a TFT according to the characteristics of each device. In this case, a leakage current significantly affects the characteristics of the TFT.

Conventionally, in a TFT using a polycrystalline silicon (poly-Si) layer, crystallized using a metal-free crystallization technique, as a semiconductor layer, a leakage current is proportional to the width of a channel region and inversely proportional to the length of the channel region. However, even if the length of the channel region is increased in order to reduce the leakage current, it is difficult to produce the intended effect. Furthermore, in a display device, as the length of a channel region increases, the size of the display device also increases and an aperture ratio decreases. Therefore, there is a specific technical limit to increase the length of the channel region.

Meanwhile, a vast amount of research is being conducted on a crystallization technique using a crystallization-inducing metal, for example a metal induced crystallization (MIC) technique, a metal induced lateral crystallization (MILC) technique and a super grain silicon (SGS) technique because the techniques may crystallize an amorphous silicon (a-Si) layer at a lower temperature in a shorter amount of time than a solid-phase crystallization (SPC) technique or an excimer laser annealing (ELA) technique. However, in a TFT using a poly-Si layer crystallized using the crystallization-inducing metal as a semiconductor layer, a leakage current of the TFT varies irrespective of the length or width of a channel region unlike in typical TFTs.

Therefore, in the TFT using the poly-Si layer crystallized using the crystallization-inducing metal as the semiconductor layer, it is impossible to predict a leakage current relative to the size of the channel region of the semiconductor layer. Also, it is difficult to determine the size of the channel region in order to obtain a desired leakage current.

SUMMARY OF THE INVENTION

Aspects of the present invention provide a thin film transistor (TFT) using a semiconductor layer crystallized using a crystallization-inducing metal, a method of fabricating the TFT, and a display device including the TFT. In the TFT using the semiconductor layer crystallized using the crystallization-inducing metal, a leakage current may be reduced by eliminating a crystallization-inducing metal from a channel region of the semiconductor layer. Also, a leakage current may be predicted according to the width and length of the channel region of the semiconductor layer. Conversely, the width and length of the channel region of the semiconductor layer may be determined considering a leakage current to be controlled.

According to an aspect of the present invention, a TFT includes: a substrate; a semiconductor layer disposed on the substrate, the semiconductor layer including a channel region and source and drain regions, and the semiconductor layer being crystallized using a crystallization-inducing metal; a gate electrode disposed to correspond to a predetermined region of the semiconductor layer; a gate insulating layer disposed between the gate electrode and the semiconductor layer to insulate the semiconductor layer from the gate electrode; and source and drain electrodes respectively electrically connected to the source and drain regions of the semiconductor layer, a metal other than the crystallization-inducing metal or a silicide of a metal different from the crystallization-inducing metal disposed at a predetermined depth from a surface of the semiconductor layer in a region spaced apart from the channel region in the semiconductor layer, and a length and width of the channel region of the semiconductor layer and a leakage current of the semiconductor layer satisfy the following equation: Ioff/W=3.4E-15 $L^2$+2.4E-12 L+c, wherein Ioff (A) is the leakage current of the semiconductor layer, W (mm) is the width of the channel region, L (μm) is the length of the channel region, and "c" is a constant ranging from 2.5E-13 to 6.8E-13.

According to another aspect of the present invention, a method of fabricating a TFT includes: providing a substrate; forming an amorphous silicon (a-Si) layer on the substrate; crystallizing the a-Si layer into a polycrystalline silicon (poly-Si) layer using a crystallization-inducing metal; determining a length and width of a channel region of a semiconductor layer according to a leakage current to be controlled using the following equation: Ioff/W=3.4E-15 $L^2$+2.4E-12 L+c, wherein Ioff is the leakage current (A) of the semiconductor layer, W is the width (mm) of the channel region, L is the length (μm) of the channel region, and "c" is a constant ranging from 2.5E-13 to 6.8E-13; patterning the poly-Si layer to form the semiconductor layer having the channel region with the determined length and width; forming a metal layer pattern or metal silicide layer pattern spaced apart from the channel region by a predetermined distance to contact a region of the semiconductor layer other than the channel region, the metal being different from the crystallization-inducing metal, and the metal silicide being a silicide of a metal different from the crystallization-inducing metal; annealing the substrate to getter the crystallization-inducing metal from the channel region of the semiconductor layer into a region of the semiconductor layer corresponding to the metal layer pattern or metal silicide layer pattern; removing the metal layer pattern or the metal silicide layer pattern; forming a gate electrode to correspond to a predetermined region of the semiconductor layer; forming a gate insulating layer between the gate electrode and the semiconductor layer to insulate the semiconductor layer from the gate electrode; and forming source and drain electrodes electrically connected to source and drain regions of the semiconductor layer, respectively.

According to yet another aspect of the present invention, a display device includes: a semiconductor layer disposed on the substrate, the semiconductor layer including a channel region and source and drain regions, and the semiconductor layer being crystallized using a crystallization-inducing metal; a gate electrode disposed to correspond to a predetermined region of the semiconductor layer; a gate insulating layer disposed between the gate electrode and the semiconductor layer to insulate the semiconductor layer from the gate electrode; source and drain electrodes respectively electrically connected to the source and drain regions of the semiconductor layer; a first electrode electrically connected to one of the source and drain electrodes; a metal other than the crystallization-inducing metal or a silicide of a metal other than the crystallization-inducing metal is disposed to a predetermined depth from a surface of the semiconductor layer in a region spaced apart from the channel region in the semiconductor layer, and a length and width of the channel region of the semiconductor layer and a leakage current of the semiconductor layer satisfy the following equation: Ioff/W=3.4E-15 $L^2$+2.4E-12 L+c, wherein Ioff (A) is the leakage current of the semiconductor layer, W (mm) is the width of the channel region, L (μm) is the length of the channel region, and "c" is a constant ranging from 2.5E-13 to 6.8E-13.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which:

FIGS. 3A through 3G are cross-sectional views illustrating a process of fabricating the TFT shown in FIG. 1;

FIGS. 5A through 5D are cross-sectional views illustrating a process of fabricating the TFT shown in FIG. 4;

DETAILED DESCRIPTION OF THE EMBODIMENTS

Figure 1:
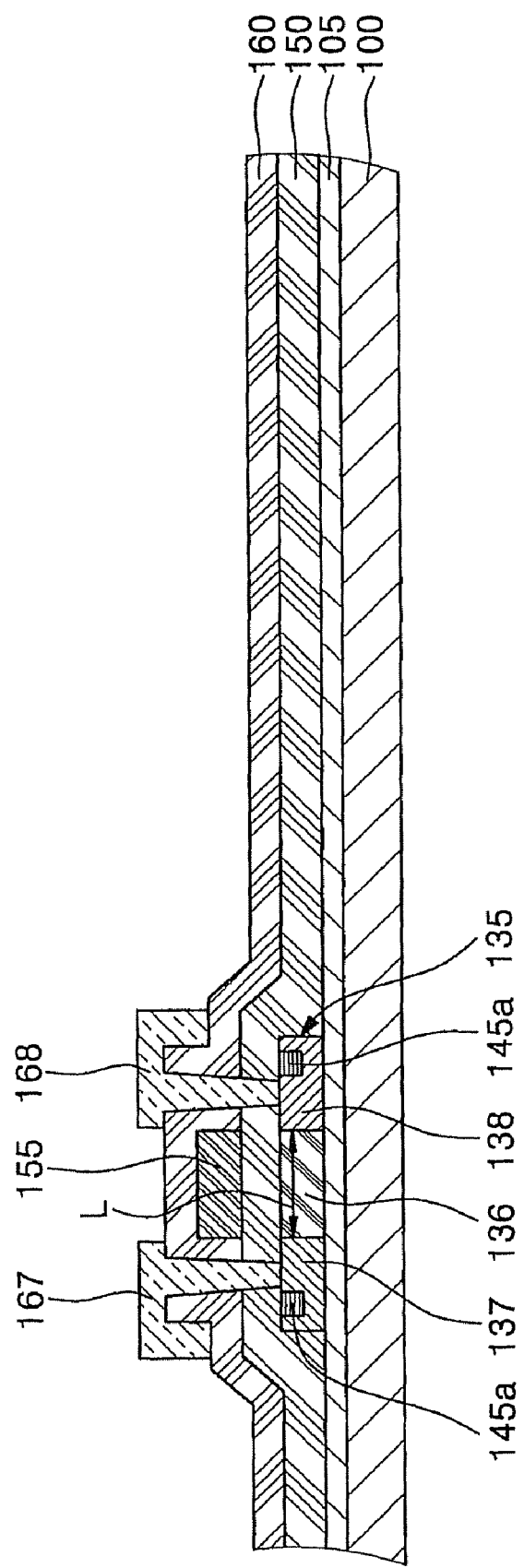
FIG. 1 is a cross-sectional view of a thin film transistor (TFT) according to an exemplary embodiment of the present invention.

Reference will now be made in detail to the present embodiments of the present invention, examples of which are illustrated in the accompanying drawings, wherein like reference numerals refer to the like elements throughout. The embodiments are described below in order to explain the aspects of the present invention by referring to the figures.

Figure 2:
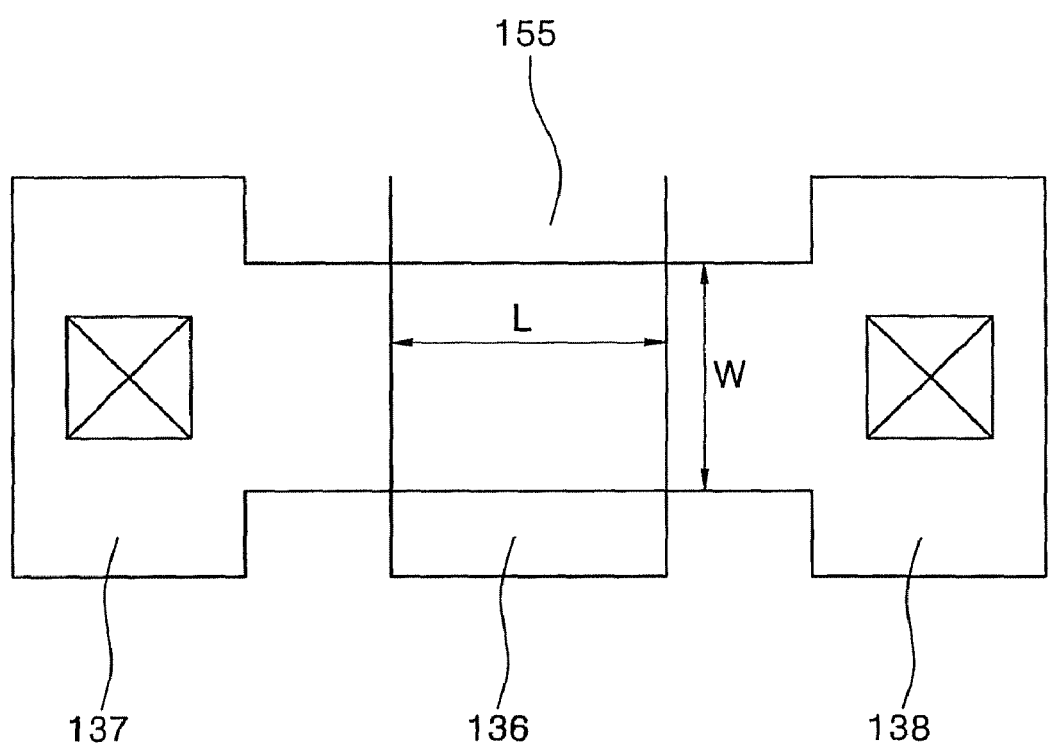
FIG. 2 is a cross-sectional view of a semiconductor layer of the TFT shown in FIG. 1.

FIG. 1 is a cross-sectional view of a thin film transistor (TFT) according to an exemplary embodiment of the present invention, and FIG. 2 is a cross-sectional view of a semiconductor layer of the TFT shown in FIG. 1.

Referring to FIG. 1, a substrate 100 is provided. The substrate 100 may be a glass substrate or a plastic substrate. A buffer layer 105 may be disposed on the substrate 100. The buffer layer 105 may prevent diffusion of moisture or impurities generated in the substrate 100 or control the transmission rate of heat during a crystallization process so as to facilitate the crystallization of an amorphous silicon (a-Si) layer. The buffer layer 105 may be formed of a single or multiple-layer insulating layer, such as a silicon oxide layer or a silicon nitride layer.

A patterned semiconductor layer 135 is disposed on the buffer layer 105. The semiconductor layer 135 may be obtained through a crystallization technique using a crystallization-inducing metal such as a metal induced crystallization (MIC) technique, a metal induced lateral crystallization (MILC) technique, or a super grain silicon (SGS) technique. The semiconductor layer 135 includes a channel region 136 and source and drain regions 137 and 138. In this case, the SGS technique is more appropriate than the MIC technique or the MILC technique in forming the semiconductor layer 135 because the SGS technique may retain a low concentration of a crystallization-inducing metal.

Referring to FIG. 2, a channel region 136 of the semiconductor layer 135 has a length L and a width W. Here, the length L of the channel region 136 corresponds to a distance between the source and drain regions 137 and 138 of the semiconductor layer 135, and the width W of the channel region 136 corresponds to a width of the channel region 136 perpendicular to the distance between the source and drain regions 137 and 138.

The length L (μm) of the channel region 136 of the semiconductor layer 135 and a leakage current Ioff(A) per 1 mm of the width W of the channel region 136 of the semiconductor layer 135, i.e., the leakage current Ioff/W as a function of the length L, can be expressed as in Equation 1:

$$Ioff/W=3.4E\text{-}15L^2+2.4E\text{-}12L+c \quad (1),$$

wherein "c" is a constant ranging from 2.5E-13 to 6.8E-13.

According to Equation 1, since a leakage current may be predicted according to the size of the channel region 136 of the semiconductor layer 135, the leakage current may be controlled using the width W or length L of the channel region 136 of the semiconductor layer 135. Conversely, since the leakage current may be predicted, the length L or width W of the channel region 136 of the semiconductor layer 135 may be determined considering a leakage current to be controlled.

Figure 9:
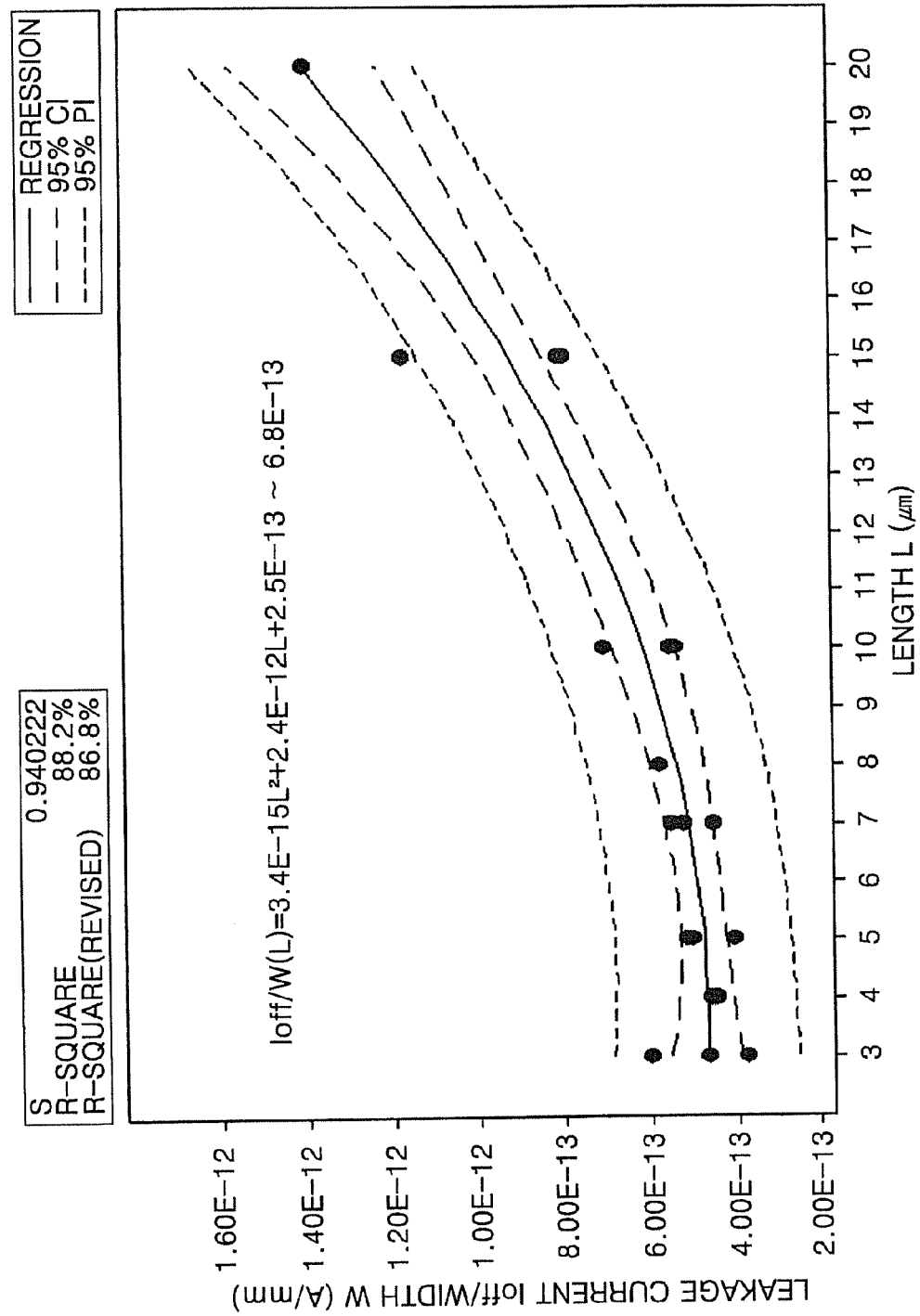
FIG. 9 is a graph of a function of a leakage current Ioff/W (A/mm) per 1 mm of the channel width W of a semiconductor layer and the channel length L (μm) of the TFT, which is obtained using regression analysis based on data shown in FIG. 8.

Referring to FIG. 9, when the width W of the channel region 136 of the semiconductor layer 135 is constant, as the length L of the channel region 136 decreases, a leakage current per 1 mm of the width W of the channel region 136 also decreases because of the more efficient removal of the crystallization-inducing metal from the channel region 136 using a region where either a metal other than the crystallization-inducing metal or a metal silicide thereof is formed. Noticeably, when the length L of the channel region 136 is more than 0 and 15 μm or less, a value Ioff/W may be 1.0E-12A or less due to a high gettering effect, so that the TFT can exhibit good characteristics in a display device.

Referring back to FIG. 1, a region 145a in which either a metal, the metal being other than the crystallization-inducing metal or a metal silicide thereof is formed is disposed in the semiconductor layer 135 to a predetermined depth from a surface of the semiconductor layer 135 and spaced apart from the channel region 136. In this case, the metal or the metal silicide is used for the gettering process. In the present embodiment, the gettering process is performed using the region 145a in which the metal or the metal silicide is formed, thereby removing the crystallization-inducing metal from the channel region 136 of the semiconductor layer 135. As a result, a leakage current may be reduced and the length L (μm) of the channel region 136 of the semiconductor layer 135 and the leakage current Ioff/W(A/mm) per 1 mm of the width W of the channel region 136 of the semiconductor layer 135 may satisfy Equation 1.

A distance between the channel region 136 and the region 145a in which either the metal other than the crystallization-inducing metal or the metal silicide thereof is formed may be constant irrespective of the length L of the channel region 136. In other words, the length L of the channel region 136 may vary, and the distance between the channel region 136 and the region 145a may be constant with respect to the length L of the channel region 136.

The metal or metal silicide used for the gettering process may have a lower diffusion coefficient than the crystallization-inducing metal in the semiconductor layer 135. Specifically, the diffusion coefficient of the metal or metal silicide used for the gettering process may be 1% or less of the diffusion coefficient of the crystallization-inducing metal in the semiconductor layer 135. In this case, the metal or metal silicide used for the gettering process may be prevented from diffusing from the region 145a into the remaining region of the semiconductor layer 135.

In general, nickel (Ni) may be used as the crystallization-inducing metal used for the crystallization of the semiconductor layer 135. Ni has a diffusion coefficient of about $10^{-5}$ cm$^2$/s or less in the semiconductor layer 135. Therefore, when Ni is used as the crystallization-inducing metal, the diffusion coefficient of the metal or metal silicide used for the gettering process may be 1% or less of the diffusion coefficient of Ni. Specifically, the metal or metal silicide may have a diffusion coefficient of $10^{-7}$ cm$^2$/s or less. In this case, the metal or metal silicide used for the gettering process may be one selected from the group consisting of Sc, Ti, Zr, Hf, V, Nb, Ta, Cr, Mo, W, Mn, Re, Ru, Os, Co, Rh, Ir, Pt, Y, La, Ce, Pr, Nd, Dy, Ho, TiN, TaN, alloys thereof, and metal suicides thereof.

Continuing in FIG. 1, a gate insulating layer 150 is disposed on the surface of the substrate 100 including the semiconductor layer 135. The gate insulating layer 150 may be a silicon oxide layer, a silicon nitride layer, or a double layer thereof. A gate electrode 155 is disposed on a region of the gate insulating layer 150 corresponding to the channel region 136 of the semiconductor layer 135. The gate electrode 155 may be a single layer formed of aluminum (Al) or an Al alloy, such as aluminum-neodymium (Al—Nd), or a multiple layer obtained by stacking an Al alloy layer on a chromium (Cr) alloy layer or a molybdenum (Mo) alloy layer.

An interlayer insulating layer 160 is disposed on the surface of the substrate 100 including the gate electrode 155. The interlayer insulating layer 160 may be a silicon nitride layer, a silicon oxide layer, or include multiple layers thereof.

Source and drain electrodes 167 and 168 are disposed on the interlayer insulating layer 160 and electrically connected to the source and drain regions 137 and 138, respectively, of the semiconductor layer 135. Thus, the TFT according to the present embodiment is completed. Alternatively, the metal or metal silicide may comprise the same material as the gate electrode 155 or the source and drain electrodes 167 and 168.

Figure 3A:
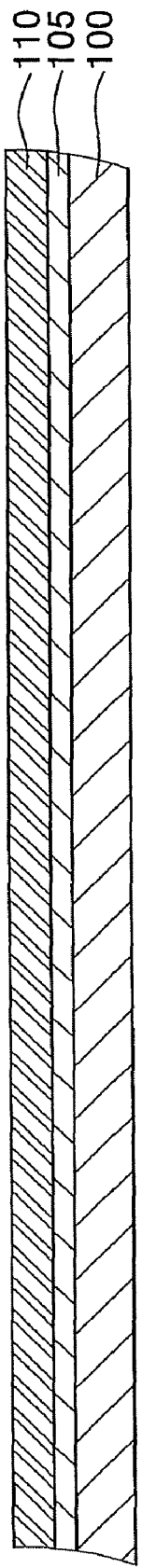

FIGS. 3A through 3G are cross-sectional views illustrating a process of fabricating the TFT shown in FIG. 1. Referring to FIG. 3A, a buffer layer 105 is formed on a substrate 100 formed of glass, stainless steel, or plastic. The buffer layer 105 may be a single layer or a multiple layer obtained by depositing an insulating layer, such as a silicon oxide layer or a silicon nitride layer, using a chemical vapor deposition (CVD) technique or a physical vapor deposition (PVD) technique. In this case, the buffer layer 105 may prevent diffusion of moisture or impurities generated in the substrate 100 or control the transmission rate of heat during a crystallization process so as to facilitate crystallization of an amorphous silicon (a-Si) layer. Although described as including the buffer layer 105, the buffer layer 105 need not be included in all aspects.

Thereafter, an a-Si layer 110 is formed on the buffer layer 105. In this case, the a-Si layer 110 may be formed using a CVD technique or a PVD technique. Also, a dehydrogenation process may be performed during or after the formation of the a-Si layer 110, thereby lowering the concentration of hydrogen therein.

Next, the a-Si layer 110 is crystallized into a polycrystalline silicon (poly-Si) layer 130 (of FIG. 3D). In the present embodiment, the crystallization of the a-Si layer 110 into the poly-Si layer 130 may be performed by a method using a crystallization-inducing metal, such as a metal induced crystallization (MIC) technique, a metal induced lateral crystallization (MILC) technique, or a super grain silicon (SGS) technique.

In the MIC technique, a crystallization-inducing metal, such as nickel (Ni), palladium (Pd), or aluminum (Al), is brought into contact with or injected into the a-Si layer 110 so that the a-Si layer 110 is crystallized into a poly-Si layer 130 due to the crystallization-inducing metal. In the MILC technique, metal silicide obtained by a reaction between a crystallization-inducing metal and silicon continuously diffuses in a lateral direction so that the a-Si layer 110 is crystallized into a poly-Si layer 130 by sequentially inducing crystallization of the silicon in the a-Si layer 110.

The SGS technique maintains a lower concentration of a crystallization-inducing metal diffusing into the a-Si layer 110 than in the MIC technique or the MILC technique, so that crystal grains may be controlled to be in the range of several μm to several hundred μm. In an exemplary embodiment of the present invention, in order to reduce the concentration of the crystallization-inducing metal diffusing into the a-Si layer 110, a capping layer 115 (of FIG. 3B) may be formed on the a-Si layer 110, and a crystallization-inducing metal layer may be formed on the capping layer and annealed so as to diffuse a crystallization-inducing metal. However, the capping layer 115 may be omitted and a low-concentration crystallization-inducing metal layer may be formed so that the concentration of a crystallization-inducing metal diffusing into the a-Si layer 110 may be reduced.

Figure 3B:
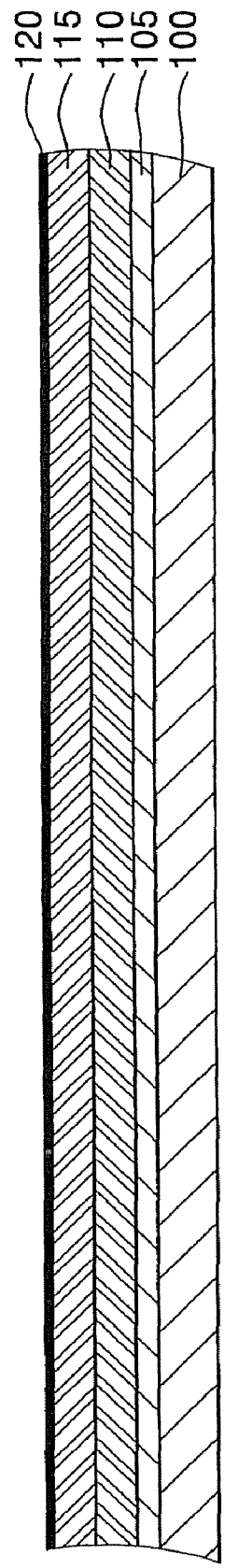

In the present embodiment, a method of forming a poly-Si layer using a SGS technique will be described. FIG. 3B is a cross-sectional view of a process of forming the capping layer 115 and a crystallization-inducing metal on the a-Si layer 110. Referring to FIG. 3B, the capping layer 115 is formed on the a-Si layer 110. The capping layer 115 may be a silicon nitride layer, in which case it is easy to control diffusion of a subsequently formed crystallization-inducing metal during an annealing process. However, the capping layer 115 may be a double layer of a silicon nitride layer and a silicon oxide layer. The capping layer 115 may be formed using a CVD technique or a PVD technique. In this case, the capping layer 115 may be formed to a thickness of about 1 to 2000 Å. When the capping layer 115 is less than 1 Å, the capping layer 115 may not control the amount of the crystallization-inducing metal diffusing into the a-Si layer 110. When the capping layer 115 is greater than 2000 Å, only a small amount of the crystallization-inducing metal diffuses into the a-Si layer 110, thereby precluding crystallization of the a-Si layer 110 into a poly-Si layer 130.

Thereafter, a crystallization-inducing metal is deposited on the capping layer 115, thereby forming a crystallization-inducing metal layer 120. The crystallization-inducing metal may be one selected from the group consisting of Ni, Pd, Ag, Au, Al, Sn, Sb, Cu, Tb, and Cd. Ni may be preferred as the crystallization-inducing metal. The crystallization-inducing metal layer 120 may be formed to an areal density of $10^{11}$ to $10^{15}$ atoms/cm$^2$ on the capping layer 115. When the crystallization-inducing metal layer 120 is formed to an areal density lower than $10^{11}$ to $10^{15}$ atoms/cm$^2$, it is difficult to crystallize the a-Si layer 110 into a poly-Si layer due to the small number of crystallization nuclei (i.e., seeds). Conversely, when the crystallization-inducing metal layer 120 is formed to an areal density higher than $10^{11}$ to $10^{15}$ atoms/cm$^2$, an excessively large amount of the crystallization-inducing metal diffuses into the a-Si layer 110, thereby reducing the size of crystal grains of a poly-Si layer and increasing the amount of the remaining crystallization-inducing metal. As a result, a semiconductor layer obtained by patterning the poly-Si layer may have degraded characteristics.

FIG. 3C is a cross-sectional view of a process of annealing the substrate 100 to diffuse the crystallization-inducing metal via the capping layer 115 to an interface between the capping layer 115 and the a-Si layer 110. Referring to FIG. 3C, the substrate 100 on which the buffer layer 105, the a-Si layer 110, the capping layer 115, and the crystallization-inducing metal layer 120 are formed is annealed (as indicated by reference numeral 125) so as to diffuse part of the crystallization-inducing metal of the crystallization-inducing metal layer 120 into the surface of the a-Si layer 110. Specifically, out of a crystallization-inducing metal 120a and 120b that diffuses due to the annealing process, only a small crystallization-inducing metal 120b diffuses into the a-Si layer 110, and a large crystallization-inducing metal 120a may neither reach the a-Si layer nor pass through the capping layer 115.

Therefore, the amount of the crystallization-inducing metal 120b that reaches the surface of the a-Si layer 110 depends on the diffusion barrier capability of the capping layer 115, which is closely associated with the thickness and density of the capping layer 115. Specifically, as the thickness or density of the capping layer 115 increases, the amount of the crystallization-inducing metal 120b that diffuses into the a-Si layer 110 decreases, and thus the size of crystal grains of a poly-Si layer 130 increases. Conversely, as the thickness or density of the capping layer 115 decreases, the amount of the crystallization-inducing metal 120b that diffuses into the a-Si layer 110 increases, and thus the size of the crystal grains of the poly-Si layer 130 decreases.

In order to prevent deformation of the substrate 100, the annealing process for diffusing the crystallization-inducing metal is performed at a temperature of about 200 to 900° C. for several seconds to several hours in consideration of the fabrication cost and yield. The annealing process may be one of a furnace process, a rapid thermal annealing (RTA) process, an ultraviolet (UV) process, and a laser process.

FIG. 3D is a cross-sectional view of a process of crystallizing the a-Si layer 110 into a poly-Si layer 130 due to the diffused crystallization-inducing metal. Referring to FIG. 3D, the a-Si layer 110 is crystallized into the poly-Si layer 130 due to the crystallization-inducing metal 120b that passes through the capping layer 115 and diffuses into the surface of the a-Si layer 110. Specifically, the diffused crystallization-inducing metal 120b combines with silicon (Si) of the a-Si layer 110 to form metal silicide as crystallization nuclei (i.e., seeds). Thus, the a-Si layer 110 is crystallized into the poly-Si layer 130 using the seeds.

Meanwhile, although FIG. 3D illustrates that the annealing process is performed on the resultant structure from which the capping layer 115 and the crystallization-inducing metal layer 120 are not removed, aspects of the present invention is not limited thereto. That is, after the crystallization-inducing metal is diffused into the a-Si layer 110 to form metal silicide, the capping layer 115 and the crystallization-inducing metal layer 120 may be removed and the resultant structure may be annealed to form the poly-Si layer 130.

Referring to FIG. 3E, the capping layer 115 and the crystallization-inducing metal layer 120 are removed, and the poly-Si layer 130 is patterned to form a semiconductor layer 135. Unlike in the present embodiment, the poly-Si layer 130 may be patterned during a subsequent process.

Here, a length and width of the semiconductor layer 135 are determined in consideration of Equation 1:

$$Ioff/W=3.4E-15L^2+2.4E-12L+c \quad (1),$$

wherein "c" is a constant ranging from 2.5E-13 to 6.8E-13. Specifically, a length L and a width W of a channel region 136 of the semiconductor layer 135 are determined according to a leakage current to be controlled, and the length and width of the semiconductor layer 135 are determined in consideration of the length L and width W of the channel region 136.

Referring to FIG. 9, when the width W of the channel region of the semiconductor layer 135 is constant, as the length L of the channel region 136 decreases, a leakage current per 1 mm of the width W of the channel region also decreases because of more efficient removal of the crystallization-inducing metal from the channel region using a subsequent metal layer or metal silicide layer used for a gettering process. Noticeably, when the length L of the channel region 136 is more than 0 and 15 μm or less, a value Ioff/W can be 1.0E-12A or less due to a high gettering effect so that the resultant TFT can exhibit good characteristics as a display device.

Thereafter, a photoresist pattern 140 is formed on a region of the semiconductor layer 135 where a channel region 136 will be defined. Conductive impurity ions are doped into the semiconductor layer 135 using the photoresist pattern 140 as a mask, thereby forming a source region 137, a drain region 138, and a channel region 136 having a length L and a width W. In this case, the impurity ions may be p-type impurity ions or n-type impurity ions. The p-type impurity ions may be ions of one selected from the group consisting of boron (B), aluminum (Al), gallium (Ga), and indium (In), and the n-type impurity ions may be ions of one selected from the group consisting of phosphorus (P), arsenic (Ar), and antimony (Sb).

Referring to FIG. 3F, the photoresist pattern 140 is removed, and a metal layer pattern or metal silicide layer pattern 145 is formed a predetermined distance apart from the channel region 136. The metal layer pattern or metal silicide layer pattern 145 is in contact with a region of the semiconductor layer 135 other than the channel region 136. In the present embodiment, depositing the metal layer pattern or metal silicide layer pattern 145 is followed by performing an annealing process to form a region 145a in the semiconductor layer 135, and a gettering process is performed using the region 145a. Thus, the crystallization-inducing metal is removed from the channel region 136 of the semiconductor layer 135 so that a leakage current may be reduced and the length L of the channel region 136 of the semiconductor layer 135 and the leakage current Ioff/W(A/mm) per 1 mm of the width W of the channel region 136 of the semiconductor layer 135 may satisfy Equation 1.

The position of the metal layer pattern or metal silicide layer pattern 145 may be constant irrespective of the length L of the channel region 136. In other words, the length L of the channel region 136 may vary, and the metal layer pattern or metal silicide layer pattern 145 may be formed such that a distance between the channel region 136 and the metal layer pattern or metal silicide layer pattern 145 is constant with respect to the length L of the channel region 136.

The metal layer pattern or metal silicide layer pattern 145 for gettering in the semiconductor layer 135 may be a metal layer pattern or metal silicide layer pattern including a metal or alloy thereof having a diffusion coefficient less than the crystallization-inducing metal 120a and 120b.

The diffusion coefficient of the metal or metal silicide of the metal layer pattern or metal silicide layer pattern 145 in the semiconductor layer 135 may be 1% or less of the diffusion coefficient of the crystallization-inducing metal 120a and 120b. In this case, the metal or metal silicide of the metal layer pattern or metal silicide layer pattern 145 may be prevented from diffusing from the region 145a into the remaining region of the semiconductor layer 135.

In general, Ni may be used as the crystallization-inducing metal 120a and 120b used for the crystallization of the semiconductor layer 135. Ni has a diffusion coefficient of about $10^{-5}$ cm$^2$/s or less in the semiconductor layer 135. Therefore, when Ni is used as the crystallization-inducing metal 120a and 120b, the diffusion coefficient of the metal or metal silicide of the metal layer pattern or metal silicide layer pattern 145 used for gettering in the semiconductor layer 135 may be 1% or less of the diffusion coefficient of Ni. Specifically, the metal or metal silicide may have a diffusion coefficient of $10^{-7}$ cm$^2$/s or less. In this case, the metal or metal silicide may be one selected from the group consisting of Sc, Ti, Zr, Hf, V, Nb, Ta, Cr, Mo, W, Mn, Re, Ru, Os, Co, Rh, Ir, Pt, Y, La, Ce, Pr, Nd, Dy, Ho, TiN, TaN, alloys thereof, and metal suicides thereof.

Also, the metal layer pattern or metal silicide layer pattern 145 may be formed to a thickness of about 30 to 10000 Å. When the metal layer pattern or metal silicide layer pattern 145 is formed to a thickness of less than about 30 Å, the crystallization-inducing metal may inefficiently getter into the region 145a of the semiconductor layer 135 that contacts the metal layer pattern or metal silicide layer pattern 145. When the metal layer pattern or metal silicide layer pattern 145 is formed to a thickness of more than about 10000 Å, the metal layer pattern or metal silicide layer pattern 145 may be delaminated due to thermal stress during a subsequent annealing process.

Thereafter, an annealing process is performed in order to remove the crystallization-inducing metal 120b, from the semiconductor layer 135, especially, the channel region 136 of the semiconductor layer 135. As a result, a metal of the metal layer pattern may diffuse from the surface of the semiconductor layer 135 that contacts the metal layer pattern or metal silicide layer pattern 145 into the semiconductor layer 135 or combine with the semiconductor layer 135 to form a metal silicide. Alternatively, a metal silicide of the metal silicide layer pattern diffuses into the semiconductor layer 135. Thus, the region 145a containing a metal other than the crystallization-inducing metal or a metal silicide thereof, is formed in a region of the semiconductor layer 135 that contacts the metal layer pattern or metal silicide layer pattern 145.

When the crystallization-inducing metal remaining in the channel region 136 of the semiconductor layer 135 diffuses into the region 145a of the semiconductor layer 135 that contacts the metal layer pattern or metal silicide layer pattern 145 due to the annealing process, the crystallization-inducing metal 120b is precipitated in the region 145a and does not diffuse any more. This is because the crystallization-inducing metal 120b is thermodynamically more stable in the region 145a containing the other metal or a metal silicide thereof than in silicon. Based on this principle, the crystallization-inducing metal 120b may be removed from the channel region 136 of the semiconductor layer 135.

In this case, the annealing process may be performed at a temperature of about 500 to 993° C. for 10 seconds to 10 hours. When the annealing process is performed at a temperature lower than 500° C., diffusion of the crystallization-inducing metal into the semiconductor layer 135 does not occur so that the crystallization-inducing metal 120b cannot move to the region 145a of the semiconductor layer 135. When the annealing process is performed at a temperature higher than 993° C. and Ni is used as the crystallization-inducing metal 120a and 120b, the Ni may be liquefied since Ni has a eutectic point of 993° C., and the substrate 100 may be deformed due to high heat.

Also, when the annealing process is performed for a time shorter than 10 seconds, it may be difficult to sufficiently remove the crystallization-inducing metal 120b from the channel region 136 of the semiconductor layer 135. When the annealing process is performed for a time longer than 10 hours, the long-duration annealing process gives rise to deformation of the substrate 100, increases the fabrication cost, and may decrease yield. Meanwhile, when the annealing process is performed at a sufficiently high temperature, it is possible to remove the crystallization-inducing metal 120b in a short time.

Referring to FIG. 3G, the metal layer pattern or metal silicide layer pattern 145 is removed, and a gate insulating layer 150 is formed on the surface of the substrate 100 having the semiconductor layer 135. The gate insulating layer 150 may be a silicon oxide layer, a silicon nitride layer, or a multi-layer thereof.

Thereafter, a metal layer (not shown) for a gate electrode is formed. The metal layer may be a single layer formed of Al or an Al alloy, such as Al—Nd, or a multiple layer formed by stacking an Al alloy on a Cr alloy or a Mo alloy. Photolithographic and etching processes are performed on the metal layer for the gate electrode, thereby forming a gate electrode 155 to correspond to the channel region 136 of the semiconductor layer 135.

Subsequently, an interlayer insulating layer 160 is formed on the surface of the substrate 100 having the gate electrode 155. The interlayer insulating layer 160 may be a silicon nitride layer, a silicon oxide layer, or a multiple layer thereof.

The interlayer insulating layer 160 and the gate insulating layer 150 are etched to form contact holes to expose the source and drain regions 137 and 138 of the semiconductor layer 135. Source and drain electrodes 167 and 168 are formed to be connected to the source and drain regions 137 and 138 through the contact holes. The source and drain electrodes 167 and 168 may be formed of one selected from the group consisting of molybdenum (Mo), chromium (Cr), tungsten (W), molybdenum tungsten (MoW), aluminum (Al), aluminum-neodymium (Al—Nd), titanium (Ti), titanium nitride (TiN), copper (Cu), a Mo alloy, an Al alloy, and a Cu alloy. As a result, a TFT including the semiconductor layer 135, the gate electrode 155, and the source and drain electrodes 167 and 168 is completed.

Alternatively, the metal layer pattern or metal suicide layer pattern 145 and the gate electrode 155 or the source and drain electrodes 167 and 168 may be formed of the same material. In this case, the metal layer pattern or metal silicide layer pattern 145 may be simultaneously formed when the gate electrode 155 or the source and the drain electrodes 167 and 168 is formed.

Figure 4:
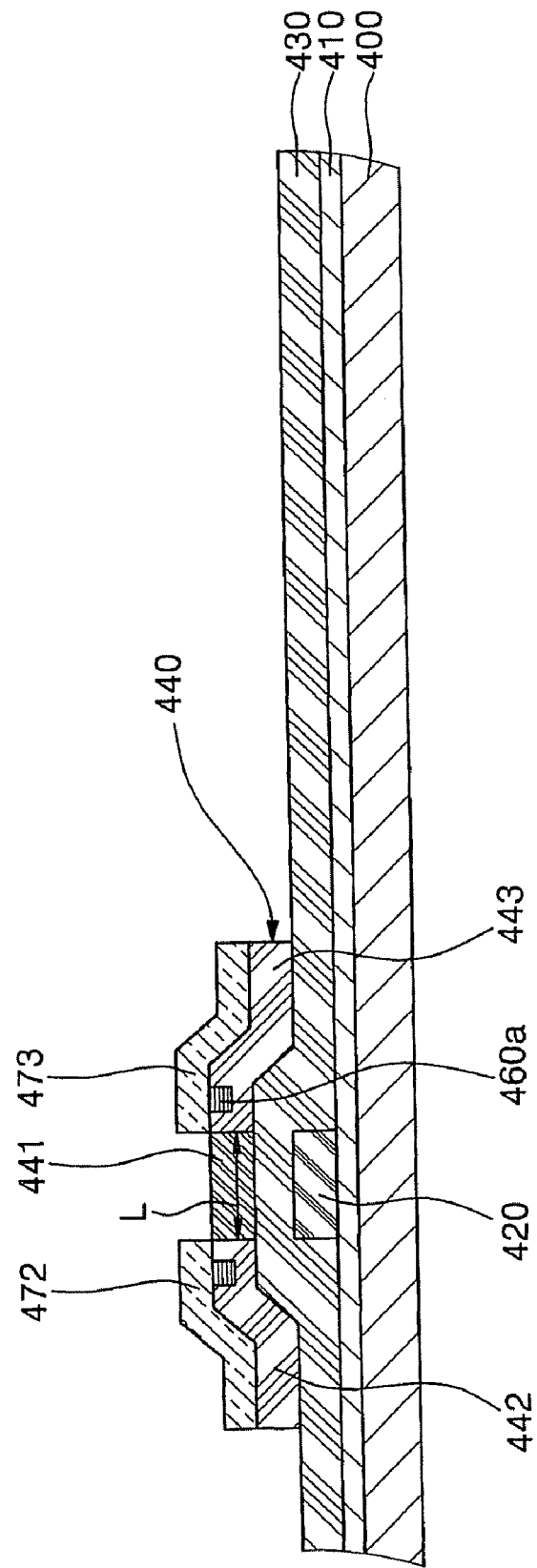
FIG. 4 is a cross-sectional view of a TFT according to another exemplary embodiment of the present invention.

FIG. 4 is a cross-sectional view of a TFT according to another embodiment of the present invention. The TFT shown in FIG. 4 is generally the same as the TFT shown in FIGS. 1 and 2 except for the following description.

Referring to FIG. 4, a substrate 400 is prepared. A buffer layer 410 may be disposed on the substrate 400. A gate electrode 420 is disposed on the buffer layer 410. A gate insulating layer 430 is disposed on the gate electrode 420.

A patterned semiconductor layer 440 is disposed on the gate insulating layer 430. The semiconductor layer 440 is a semiconductor layer crystallized by a method using a crystallization-inducing metal, such as an MIC technique, an MILC technique, or an SGS technique. The semiconductor layer 440 includes a channel region 441 and source and drain regions 442 and 443. In this case, the SGS technique is more appropriate than the MIC technique or the MILC technique in forming the semiconductor layer 440 because the SGS technique may maintain a low concentration of a crystallization-inducing metal diffusing into an a-Si layer.

A length L (μm) of the channel region 441 of the semiconductor layer 440 and a leakage current Ioff(A) per 1 mm of a width W of the channel region 441 of the semiconductor layer 440 satisfy Equation 1:

$$Ioff/W = 3.4E\text{-}15L^2 + 2.4E\text{-}12L + c \quad (1),$$

wherein "c" is a constant ranging from 2.5E-13 to 6.8E-13.

Based on Equation 1, since a leakage current may be predicted according to the size of the channel region 441 of the semiconductor layer 440, the leakage current may be controlled using the width W or length L of the channel region 441 of the semiconductor layer 440. Conversely, since the leakage current may be predicted, the length L or width W of the channel region 441 of the semiconductor layer 440 may be determined considering a leakage current to be controlled.

Referring to FIG. 9, when the width W of the channel region 441 of the semiconductor layer 440 is constant, as the length L of the channel region 441 decreases, a leakage current per 1 mm of the width W of the channel region 441 also decreases because of the more efficient removal of the crystallization-inducing metal from the channel region 441 using a region in which a metal other than the crystallization-inducing metal or metal silicide thereof is formed. Noticeably, when the length L of the channel region 441 is more than 0 and 15 μm or less, a value Ioff/W can be 1.0E-12A or less due to a high gettering effect, so that the TFT can exhibit good characteristics in a display device.

A region 460a in which either a metal other than the crystallization-inducing metal or a metal silicide thereof is formed is disposed to a predetermined depth from the surface of the semiconductor layer 135 in the semiconductor layer 440 and spaced apart from the channel region 441. In this case, the metal or the metal silicide is used for a gettering process. In the present embodiment, a gettering process is performed using the region 460a in which the metal or the metal silicide is formed, thereby removing the crystallization-inducing metal from the channel region 441 of the semiconductor layer 440. As a result, a leakage current may be reduced and the length L (μm) of the channel region 441 of the semiconductor layer 440 and the leakage current Ioff(A) per 1 mm of the width W of the channel region 441 of the semiconductor layer 440 may satisfy Equation 1.

A distance between the channel region 441 and the region 460a in which either the metal other than the crystallization-inducing metal or the metal silicide thereof is formed may be constant irrespective of the length L of the channel region 441.

Source and drain electrodes 472 and 473 are disposed on the semiconductor layer 440 and electrically connected to the source and drain regions 442 and 443, respectively, of the semiconductor layer 440. Thus, the TFT according to the present embodiment is completed.

FIGS. 5A through 5D are cross-sectional views of a process of fabricating the TFT shown in FIG. 4. The process shown in FIGS. 5A through 5D is generally the same as the process shown in FIGS. 3A through 3G except for the following description.

Referring to FIG. 5A, a buffer layer 410 is formed on a substrate 400. A metal layer (not shown) for a gate electrode is formed on the buffer layer 410 and etched using photolithographic and etching processes, thereby forming a gate electrode 420. A gate insulating layer 430 is formed on the substrate 400 having the gate electrode 420.

Referring to FIG. 5B, an a-Si layer is formed on the gate insulating layer 430 and crystallized into a poly-Si layer using a crystallization-inducing metal as in the previous embodiment. The poly-Si layer is patterned to form a semiconductor layer 440. The poly-Si layer may be patterned during a subsequent process.

Here, a length and width of the semiconductor layer 135 are determined in consideration of Equation 1:

$$Ioff/W = 3.4E\text{-}15L^2 + 2.4E\text{-}12L + c \quad (1),$$

wherein "c" is a constant ranging from 2.5E-13 to 6.8E-13. Specifically, a length L and a width W of a channel region of the semiconductor layer 440 are determined according to a leakage current to be controlled, and the length and width of the semiconductor layer 440 are determined in consideration of the length L and width W of the channel region.

Referring to FIG. 9, when the width W of the channel region of the semiconductor layer 440 is constant, as the length L of the channel region decreases, a leakage current per 1 mm of the width W of the channel region also decreases because of the more efficient removal of the crystallization-inducing metal from the channel region using a subsequent metal layer or metal silicide layer used for a gettering process. Noticeably, when the length L of the channel region is more than 0 and 15 μm or less, a value Ioff/W can be 1.0E-12A or less due to a high gettering effect, so that the resultant TFT can exhibit good characteristics in a display device.

Thereafter, a photoresist pattern 450 is formed on a region of the semiconductor layer 440 where a channel region will be defined. Conductive impurity ions are doped into the semiconductor layer 440 using the photoresist pattern 450 as a mask, thereby forming a source region 442, a drain region 443, and a channel region 441 having a length L and a width W.

Referring to FIG. 5C, the photoresist pattern 450 is removed, and a metal layer pattern or metal silicide layer pattern 460 is formed a predetermined distance apart from the channel region 441. The metal layer pattern or metal silicide layer pattern 460 is in contact with a region of the semiconductor layer 440 other than the channel region 441.

In the present embodiment, depositing the metal layer pattern or metal silicide layer pattern 460 is followed by performing an annealing process to form a region 460a in the semiconductor layer 440, and a gettering process is performed using the region 460a. Thus, the crystallization-inducing metal is removed from the channel region 136 of the semiconductor layer 135 so that a leakage current may be reduced and the length L of the channel region 136 of the semiconductor layer 135 and the leakage current Ioff(A) per 1 mm of the width W of the channel region 136 of the semiconductor layer 135 may satisfy Equation 1.

The position of the metal layer pattern or metal silicide layer pattern 460 may be constant irrespective of the length L of the channel region 441. In other words, the length L of the channel region 441 may vary, and the metal layer pattern or metal silicide layer pattern 460 may be formed such that a distance between the channel region 441 and the metal layer pattern or metal silicide layer pattern 460 is constant with respect to the length L of the channel region 441.

Thereafter, an annealing process is performed in order to remove the crystallization-inducing metal from the semiconductor layer 440, especially, the channel region 441 of the semiconductor layer 440. As a result, a region 460a containing a metal other than the crystallization-inducing metal or a metal silicide thereof is formed in a region of the semiconductor layer 440 that contacts the metal layer pattern or metal silicide layer pattern 460. The region 460a is formed in the surface of the semiconductor layer 440 to a predetermined depth. The crystallization-inducing metal existing in the channel region 441 of the semiconductor layer 440 is gettered by diffusion into the region 460a. The annealing process is performed in a similar manner as described above.

Referring to FIG. 5D, the metal layer pattern or metal silicide layer pattern 460 is removed, and a source/drain conductive layer is formed on the semiconductor layer 440 and patterned, thereby forming source and drain electrodes 472 and 473. As a result, a TFT including the gate electrode 420, the semiconductor layer 440, and the source and drain electrodes 472 and 473 is completed.

Figure 6:
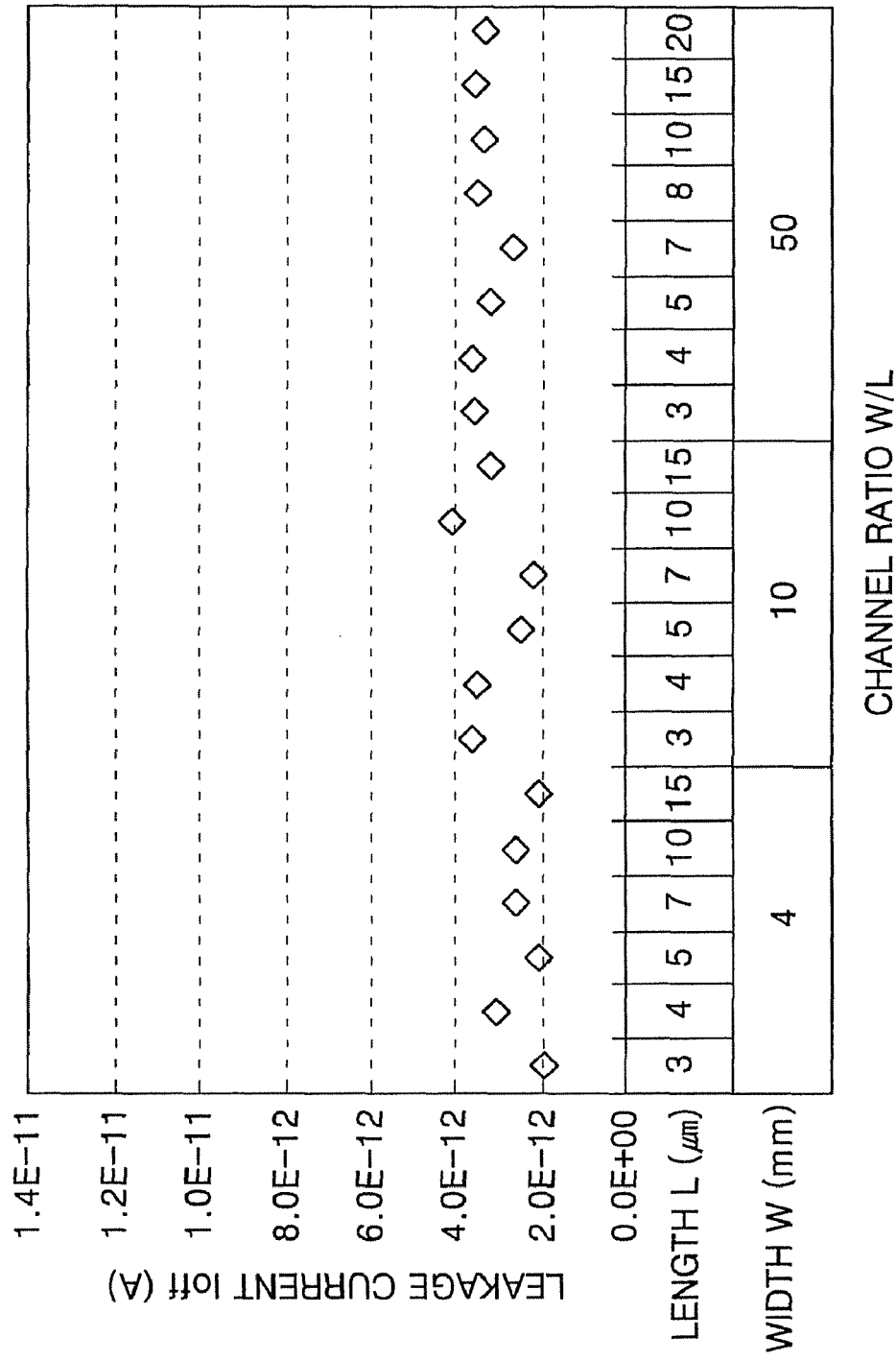
FIG. 6 is a graph of leakage current Ioff(A) versus channel ratio (=a channel width W (mm)/a channel length L (μm)) of a conventional TFT using a semiconductor layer crystallized using a crystallization-inducing metal.

FIG. 6 is a graph of leakage current Ioff(A) versus channel ratio (i.e., a channel width W (mm)/a channel length L (μm)) of a conventional TFT using a semiconductor layer crystallized using a crystallization-inducing metal. In FIG. 6, the abscissa denotes the channel ratio (i.e., the channel width W (mm)/the channel length L (μm)), and the ordinate denotes the leakage current Ioff(A).

Referring to FIG. 6, it can be seen that the leakage current Ioff(A) of the conventional TFT using the semiconductor layer crystallized using the crystallization-inducing metal shows no tendency but irregularly increases or decreases when the channel width W is 4, 10, and 50 mm, respectively, or when the channel length L ranges from 3 to 20 μm. Also, even if the channel ratio varies, the leakage current Ioff(A) varies within only a small range from 2.0E-12 to 4.0E-12A, which makes no significant difference. Therefore, it can be seen that in the conventional TFT, the leakage current Ioff(A) is not effectively controlled by changing the channel ratio. Thus, unlike in a TFT according to an exemplary embodiment of the present invention, in the conventional TFT using the semiconductor layer crystallized using the crystallization-inducing metal, it is difficult to predict a change in the leakage current Ioff(A) according to the channel ratio, or to precisely control the leakage current by changing the channel ratio. Conversely, the size of a channel region cannot be determined considering a leakage current Ioff(A) to be controlled.

Figure 7:
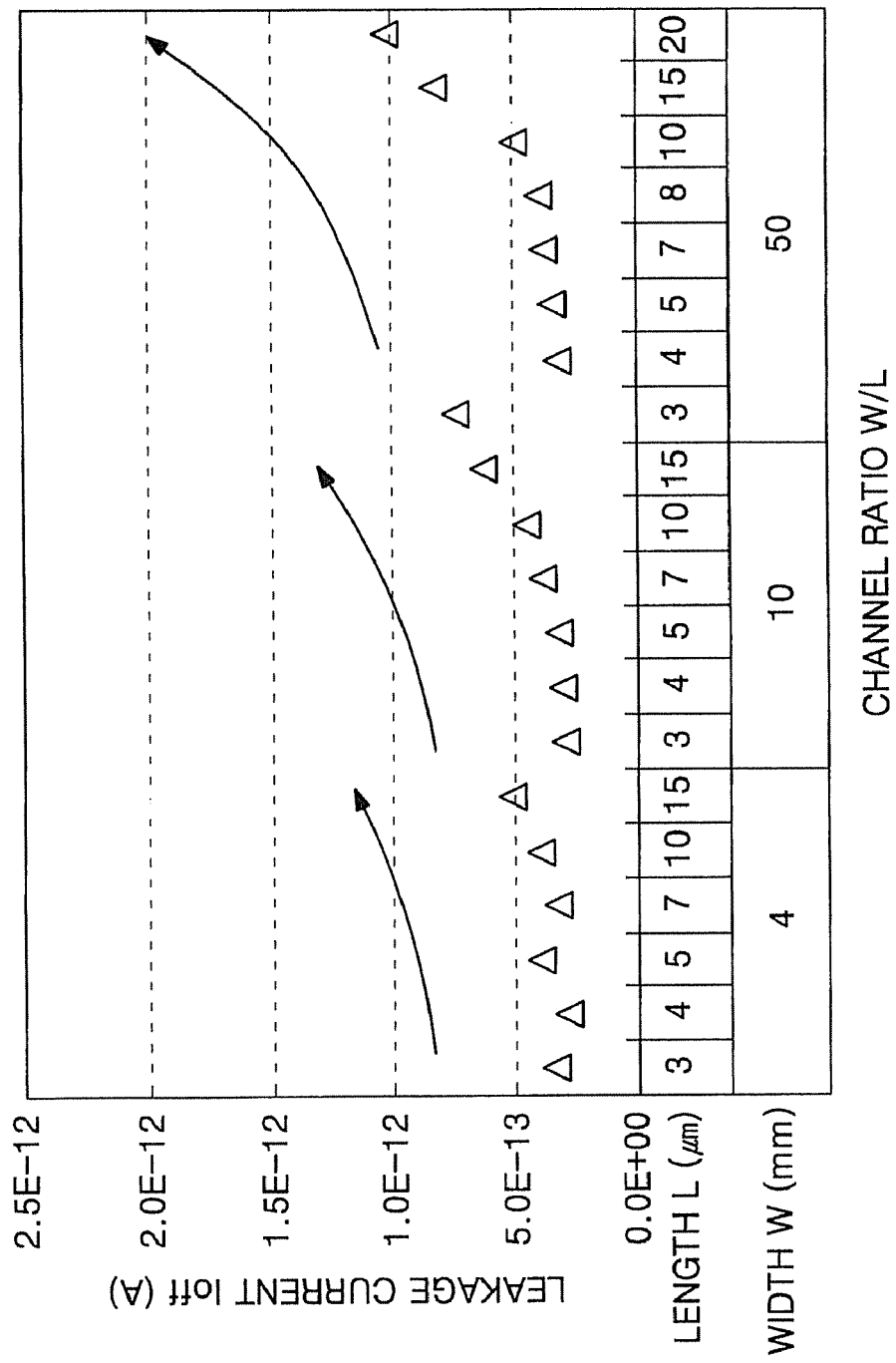
FIG. 7 is a graph of leakage current versus channel ratio of a TFT according to an exemplary embodiment of the present invention.

FIG. 7 is a graph of leakage current Ioff(A) versus channel ratio of a TFT according to an exemplary embodiment of the present invention in which a metal layer pattern or metal silicide layer pattern for a gettering process is formed and annealed. In FIG. 7, an abscissa denotes the channel ratio (=the channel width W (mm)/the channel length L (μm)), and an ordinate denotes the leakage current Ioff(A).

Referring to FIG. 7, even if the TFT according to the exemplary embodiment of the present invention has the same channel ratio as the conventional TFT described with reference to FIG. 6, the leakage current Ioff(A) was greatly reduced to approximately 5.0E-13A. That is, when the metal layer pattern or metal silicide layer pattern for the gettering process is formed and annealed, it can be confirmed that a crystallization-inducing metal existing in a channel region is gettered.

Figure 8:
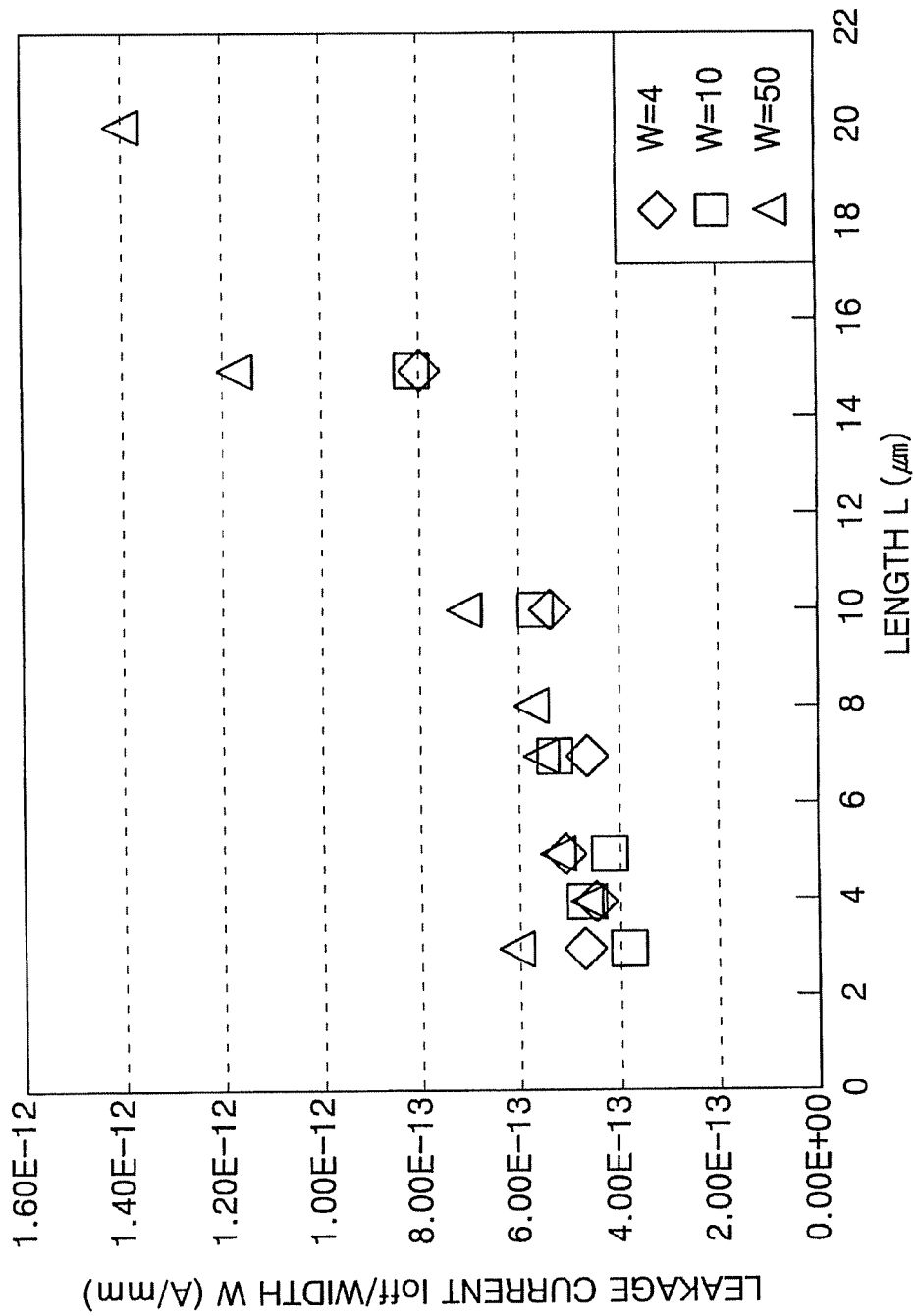
FIG. 8 is a graph of leakage current Ioff/W (A/mm) per 1 mm of the channel width W of a semiconductor layer versus channel length L (μm) of a TFT according to an exemplary embodiment of the present invention.

FIG. 8 is a graph of leakage current Ioff(A) per 1 mm of the channel width W of a semiconductor layer versus channel length L (μm) of a TFT according to an exemplary embodiment of the present invention. In FIG. 8A, the abscissa denotes the channel length L (μm), and the ordinate denotes the leakage current Ioff(A) per 1 mm of the channel width W.

In order to comprehend a correlation between the channel length L of the TFT according to the exemplary embodiment of the present invention and a leakage current Ioff(A), the leakage current Ioff shown in FIG. 7 is divided by the channel width W, and FIG. 8 shows leakage current Ioff/W divided by the channel width W versus channel length L. As a result, it can be seen that as the channel length L increases, the value Ioff/W increases according to the curve shown in FIG. 8. That is, when the channel width W is constant, as the channel length L increases, the leakage current Ioff increases according to the curve of FIG. 8, which is a quadratic function.

FIG. 9 is a graph of a function of a leakage current Ioff(A) per 1 mm of the channel width W of a semiconductor layer and the channel length L (μm) of the TFT, which is obtained using regression analysis based on data shown in FIG. 8. In FIG. 9, the abscissa denotes the channel length L (μm), and the ordinate denotes the leakage current Ioff(A) per 1 mm of the channel width W.

Referring to FIG. 9, Ioff/W=3.4E-15 $L^2$+2.4E-12 L+2.5E-13 to 6.8E-13 is obtained using regression analysis and is a function correlating the leakage current Ioff/W and the channel length L based on data shown in FIG. 8. Here, the leakage current Ioff, the channel width W, and the channel length L are expressed in units of A, mm, and μm, respectively.

Accordingly, in the TFT according to the exemplary embodiment of the present invention, the crystallization-inducing metal may be removed from the channel region of the semiconductor layer, thereby reducing the leakage current. Also, since the leakage current may be predicted according to the size of the channel region of the semiconductor layer, the leakage current may be determined by controlling the width W or length L of the channel region of the semiconductor layer. Conversely, the length L or width W of the channel region of the semiconductor layer may be determined considering the leakage current to be controlled.

Furthermore, referring to FIG. 9, in the TFT according to the exemplary embodiment of the present invention, when the width W of the channel region of the semiconductor layer is constant, as the length L of the channel region decreases, a leakage current per 1 mm of the width W of the channel region also decreases according to a secondary functional curve because of the more efficient removal of the crystallization-inducing metal from the channel region using the metal layer pattern or metal silicide layer pattern for a gettering process. In particular, when the length L of the channel region is more than 0 and 15 µm or less, the value Ioff/W can be 1.0E-12A or less due to a high gettering effect, so that the resultant TFT can exhibit good characteristics as a display device.

Figure 10:
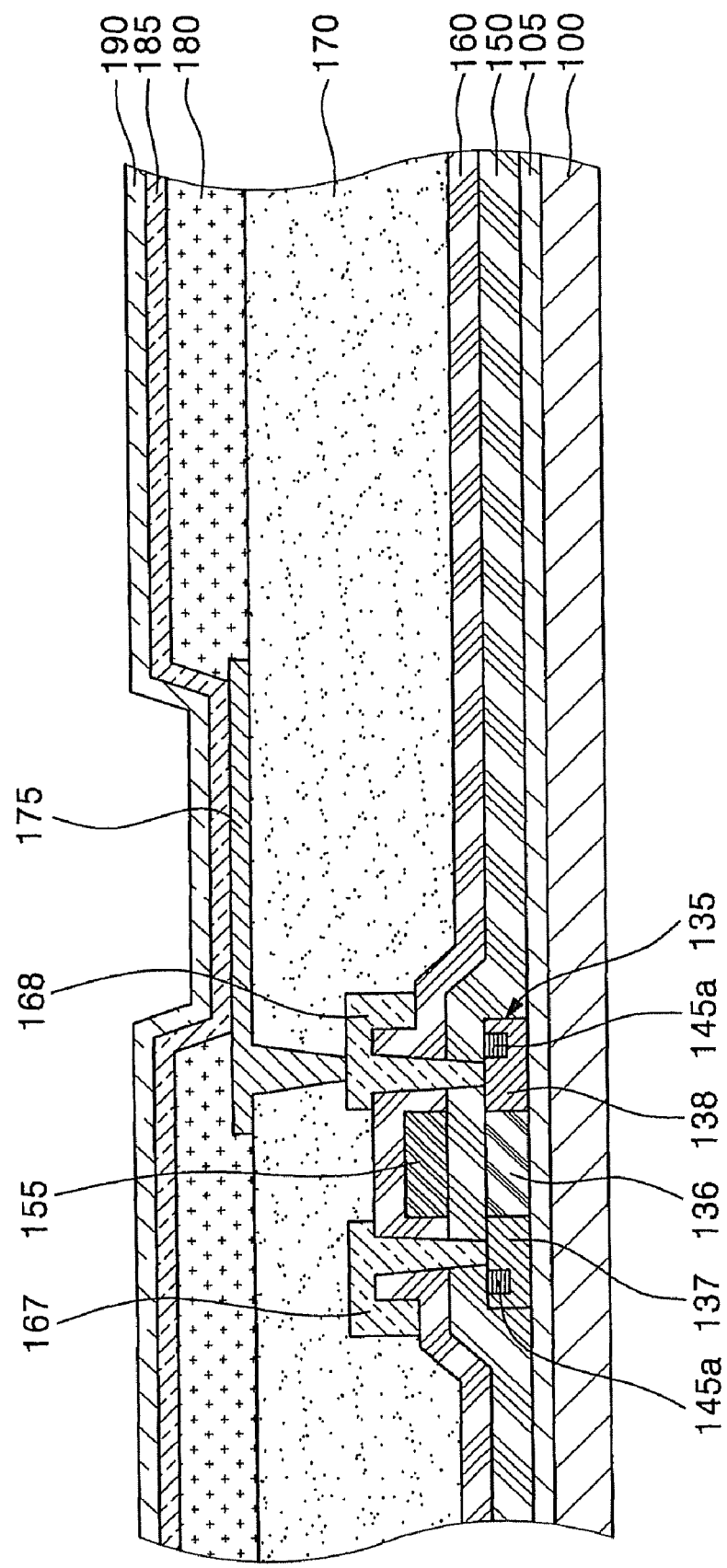
FIG. 10 is a cross-sectional view of an organic light emitting diode (OLED) display device including the TFT shown in FIG. 1.

FIG. 10 is a cross-sectional view of an organic light emitting diode (OLED) display device including the TFT shown in FIG. 1. Although aspects of the present invention are described with reference to an OLED, the aspects of the present invention are not limited thereto such that the TFT according to aspects of the present invention may be used in other display devices, such as a liquid crystal display or a plasma display panel, among others. Referring to FIG. 10, an insulating layer 170 is formed on the surface of the substrate 100 having the TFT shown in FIG. 3G, according to the present embodiment. The insulating layer 170 may be an inorganic layer selected from the group consisting of a silicon oxide layer, a silicon nitride layer, and a silicon on glass (SOG) layer, an organic layer formed of one selected from the group consisting of polyimide, benzocyclobutene (BCB) series resin, and acrylate, or a stacked layer of the inorganic layer and the organic layer.

The insulating layer 170 may be etched to form a via hole exposing one of the source and drain electrodes 167 and 168. A first electrode 175 is formed and connected to one of the source and drain electrodes 167 and 168 through the via hole. The first electrode 175 may be an anode or a cathode. When the first electrode 175 is an anode, the anode may be formed of a transparent conductive material selected from the group consisting of indium tin oxide (ITO), indium zinc oxide (IZO), and indium tin zinc oxide (ITZO). When the first electrode 175 is a cathode, the cathode may be formed of one selected from the group consisting of Mg, Ca, Al, Ag, Ba, and alloys thereof.

Thereafter, a pixel defining layer 180 is formed on the first electrode 175 to have an opening that exposes a portion of the first electrode 175. An organic layer 185 including an emission layer (EML) is formed on the exposed portion of the first electrode 175. The organic layer 185 may further include a hole injection layer (HIL), a hole transport layer (HTL), a hole blocking layer (HBL), an electron blocking layer (EBL), an electron injection layer (EIL), and an electron transport layer (ETL), among other layers. After that, a second electrode 190 is formed on the organic layer 185. As a result, the fabrication of the OLED according to the present embodiment is completed.

In the TFT according to the exemplary embodiment of the present invention, a region in which either a metal other than a crystallization-inducing metal or a metal silicide thereof is formed is disposed in a semiconductor layer crystallized using the crystallization-inducing metal. The region in which the metal or metal silicide is formed is spaced apart from a channel region of the semiconductor layer and extends from the surface of the semiconductor layer to a predetermined depth. In the present embodiment, a gettering process is performed using the region in which the metal or the metal silicide is formed, thereby removing the crystallization-inducing metal from the channel region of the semiconductor layer. As a result, a leakage current may be decreased. Also, since the leakage current may be predicted according to the size of the channel region of the semiconductor layer, the leakage current may be determined by controlling the width W or length L of the channel region of the semiconductor layer. Conversely, the width W or length L of the channel region of the semiconductor layer may be determined considering a leakage current to be controlled.

According to aspects of the present invention as described above, in a TFT including a semiconductor layer crystallized using a crystallization-inducing metal, the crystallization-inducing metal can be removed from a channel region of the semiconductor layer. As a result, a leakage current can be reduced. Also, the leakage current can be predicted according to the width or length of the channel region of the semiconductor layer. Furthermore, the width or length of the channel region of the semiconductor layer may be determined considering a leakage current to be controlled.

Further, although aspects of the present invention are described in association with an organic light emitting diode display devices, the aspects of the present invention are not limited thereto such that the thin film transistor according to the aspects of the present invention may be used with other display devices, such as liquid crystal displays and plasma display panels.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A thin film transistor, comprising:
   a substrate;
   a semiconductor layer disposed on the substrate, the semiconductor layer including a channel region and source and drain regions, and the semiconductor layer being crystallized using a crystallization-inducing metal;
   a gate electrode disposed to correspond to a predetermined region of the semiconductor layer;
   a gate insulating layer disposed between the gate electrode and the semiconductor layer to insulate the semiconductor layer from the gate electrode;
   source and drain electrodes respectively electrically connected to the source and drain regions of the semiconductor layer
   a metal other than the crystallization-inducing metal or a silicide of a metal other than the crystallization-inducing metal disposed at a predetermined depth from a surface of the semiconductor layer in a region spaced apart from the channel region in the semiconductor layer, and
   a length and a width of the channel region of the semiconductor layer and a leakage current of the semiconductor layer satisfy the following equation:

$$Ioff/W=(3.4E-15)*L^2+(2.4E-12)*L+c,$$

wherein Ioff (A) is the leakage current of the semiconductor layer, W (mm) is the width of the channel region, L (µm) is the length of the channel region, and "c" is a constant ranging from 2.5E-13 to 6.8E-13.

2. The thin film transistor according to claim 1, wherein the length of the channel region of the semiconductor layer is more than 0 and 15 µm or less.

3. The thin film transistor according to claim 1, wherein the metal other than the crystallization-inducing metal or the metal silicide has a lower diffusion coefficient than the crystallization-inducing metal in the semiconductor layer.

4. The thin film transistor according to claim 3, wherein the diffusion coefficient of the metal other than the crystallization-inducing metal or the metal silicide is 1% or less of the diffusion coefficient of the crystallization-inducing metal in the semiconductor layer.

5. The thin film transistor according to claim 4, wherein the crystallization-inducing metal comprises nickel (Ni), and the metal other than Ni or the metal silicide has a diffusion coefficient higher than 0 and equal to or lower than $10^{-7}$ cm$^2$/s.

6. The thin film transistor according to claim 4, wherein the metal other than the crystallization-inducing metal or the metal silicide comprises one selected from the group consisting of Sc, Ti, Zr, Hf, V, Nb, Ta, Cr, Mo, W, Mn, Re, Ru, Os, Co, Rh, Ir, Pt, Y, La, Ce, Pr, Nd, Dy, Ho, TiN, TaN, alloys thereof, and metal silicides thereof.

7. The thin film transistor according to claim 1, wherein the semiconductor layer is crystallized using a super grain silicon (SGS) technique.

8. The thin film transistor according to claim 1, wherein the metal other than the crystallization-inducing metal or the metal silicide comprises the same material as the gate electrode or the source and drain electrodes.

9. A display device, comprising:
a substrate;
a semiconductor layer disposed on the substrate, the semiconductor layer including a channel region and source and drain regions, and the semiconductor layer being crystallized using a crystallization-inducing metal;
a gate electrode disposed to correspond to a predetermined region of the semiconductor layer;
a gate insulating layer disposed between the gate electrode and the semiconductor layer to insulate the semiconductor layer from the gate electrode;
source and drain electrodes respectively electrically connected to the source and drain regions of the semiconductor layer;
a first electrode electrically connected to one of the source and drain electrodes;
a metal other than the crystallization-inducing metal or a silicide of a metal other than the crystallization-inducing metal disposed at a predetermined depth from a surface of the semiconductor layer in a region spaced apart from the channel region in the semiconductor layer; and
a length and a width of the channel region of the semiconductor layer and a leakage current of the semiconductor layer satisfy the following equation:

$$Ioff/W = (3.4E\text{-}15)*L^2 + (2.4E\text{-}12)*L + c,$$

wherein Ioff (A) is the leakage current of the semiconductor layer, W (mm) is the width of the channel region, L (μm) is the length of the channel region, and "c" is a constant ranging from 2.5E-13 to 6.8E-13.

10. The display device of claim 9, wherein the display further comprises:
an organic layer including an emission layer disposed on the first electrode; and
a second electrode disposed on the organic layer.

11. The display device according to claim 9, wherein the length of the channel region of the semiconductor layer is more than 0 and 15 μm or less.

12. The display device according to claim 9, wherein the metal other than the crystallization-inducing metal or the metal silicide has a lower diffusion coefficient than the crystallization-inducing metal in the semiconductor layer.

13. The display device according to claim 12, wherein the diffusion coefficient of the metal other than the crystallization-inducing metal or the metal silicide is 1% or less of the diffusion coefficient of the crystallization-inducing metal in the semiconductor layer.

14. The display device according to claim 13, wherein the crystallization-inducing metal comprises nickel (Ni), and the metal other than Ni or the metal silicide has a diffusion coefficient higher than 0 and equal to or lower than $10^{-7}$ cm$^2$/s.

15. The display device according to claim 13, wherein the metal other than the crystallization-inducing metal or the metal silicide comprises one selected from the group consisting of Sc, Ti, Zr, Hf, V, Nb, Ta, Cr, Mo, W, Mn, Re, Ru, Os, Co, Rh, Ir, Pt, Y, La, Ce, Pr, Nd, Dy, Ho, TiN, TaN, alloys thereof, and metal silicides thereof.

16. The display device according to claim 9, wherein the semiconductor layer is crystallized using a super grain silicon (SGS) technique.

* * * * *